United States Patent [19]
Tung

[11] Patent Number: 6,140,193
[45] Date of Patent: Oct. 31, 2000

[54] METHOD FOR FORMING A HIGH-VOLTAGE SEMICONDUCTOR DEVICE WITH TRENCH STRUCTURE

[75] Inventor: Ming-Tsung Tung, Hsin-Chu, Taiwan

[73] Assignee: United Microelectronics Corp., Hsin-Chu, Taiwan

[21] Appl. No.: 09/310,240

[22] Filed: May 12, 1999

[51] Int. Cl.[7] .................................................. H01L 21/336
[52] U.S. Cl. .......................................... 438/306; 438/296
[58] Field of Search .................................. 438/248, 252, 438/296, 301, 305, 306

[56] References Cited

U.S. PATENT DOCUMENTS

| | | | |
|---|---|---|---|
| 4,835,584 | 5/1989 | Lancaster | 357/23.1 |
| 5,236,858 | 8/1993 | Lee | 437/52 |
| 5,430,324 | 7/1995 | Bencuya | 257/330 |
| 5,539,238 | 7/1996 | Malhi | 257/510 |
| 5,716,886 | 2/1998 | Wen | 437/40 |
| 5,874,341 | 2/1999 | Gardener | 438/301 |
| 6,013,545 | 1/2000 | Lee | 438/217 |

*Primary Examiner*—Mary Wilczewski
*Assistant Examiner*—David Goodwin
*Attorney, Agent, or Firm*—Harness, Dickey & Pierce, P.L.C.

[57] ABSTRACT

A method for forming high-voltage semiconductor devices that have trench structure, substantially facilitating the integration of the high-voltage devices and the low-voltage devices, is disclosed. The method includes providing a semiconductor substrate, and forming a blocking layer on the substrate. The blocking layer and the substrate are defined and etched to form at least two trenches therein. Next, the substrate is firstly implanted using the blocking layer as a mask to form at least two drift regions. After refilling the trenches by a dielectric layer to form at least two dielectric regions in the substrate, a gate is then formed and patterned to form a gate region on the substrate, wherein the gate region covers the channel region and portions of the dielectric regions. Finally, secondly implanting the substrate is performed to form source/drain region using the gate region and the dielectric regions as a mask.

15 Claims, 5 Drawing Sheets

METHOD FOR FORMING A HIGH-VOLTAGE SEMICONDUCTOR DEVICE WITH TRENCH STRUCTURE

BACKGROUND OF THE INVENTION

1. Field of the Invention

The present invention relates to integration of high-voltage devices and low-voltage devices, and more particularly, to a method for fabricating high-voltage semiconductor devices having a trench structure.

2. Description of the Prior Art

As the scale of integrated circuits (ICs) has been rapidly decreased, the design and layout rule becomes more stringent. Moreover, as the integrated circuits (ICs) are fabricated to be more compact, the integration of ICs with different application becomes indispensable.

FIG. 1 shows the cross section of a conventional high-voltage complimentary metal-oxide-semiconductor (HV-CMOS) transistor, which usually includes a p-type substrate 10, field oxide regions 4, an n$^+$ source region 2, an n$^+$ drain region 2A, a gate region 3, and an oxide layer 5. In the structure of the shown transistor, the structure of its drift region generally adopts conventional local oxidation (LOCOS) technique, which has a horizontal or lateral configuration. On the other hand, low-voltage semiconductor devices in the deep-submicron semiconductor technology (e.g., less than 0.25 micrometer) largely utilize trench oxide structure, which has a vertical configuration, to save chip area. Accordingly, in the present semiconductor industry, the difference of the used configuration becomes a bottleneck for the integration of the high-voltage devices and the low-voltage devices. Moreover, the conventional high-voltage devices suffer current driving capability when the structure is scaled down.

For the foregoing reasons, there is a need for disclosing a structure and a method of fabricating high-voltage semiconductor devices having an improved current driving capability, and facilitating the integration with the low-voltage semiconductor devices.

SUMMARY OF THE INVENTION

In accordance with the present invention, a method is provided for forming high-voltage semiconductor devices that have trench structure, substantially facilitating the integration of the high-voltage devices and the low-voltage devices. Moreover, the present invention provides a method for improving the current driving capability of the high-voltage devices. In one embodiment, the present invention includes providing a semiconductor substrate having a first conductivity type, and forming a pad oxide layer on the substrate. Next, a silicon nitride layer is formed on the pad oxide layer, and the silicon nitride layer, the pad oxide layer and the substrate are then patterned and etched to form at least two trenches therein. The substrate is firstly implanted using the silicon nitride layer as a mask to form at least two drift regions having a second conductivity type opposite to the first conductivity type. Next, a first oxide layer is formed on the sidewall surface and the bottom surface of the trenches, followed by refilling the trenches by a second oxide layer to form at least two oxide regions in the substrate, wherein one of the oxide regions is spaced from the other of the oxide regions by a channel region. The oxide regions are further densified, and are planarized. Secondly implanting the substrate is performed to form at least two implanted well regions having the second conductivity type, each of the implanted well regions being adjacent to one of the oxide regions, and each of the implanted regions being spaced from the channel region by such adjacent oxide region. Subsequently, a gate oxide layer is formed over the substrate, and a polysilicon layer is then formed on the gate oxide layer. The gate oxide layer and the polysilicon layer are then patterned to form a gate region on the substrate, wherein the gate region covers the channel region and portions of the oxide regions. Finally, thirdly implanting the substrate is performed to form source/drain region using the gate region and the oxide regions as a mask.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
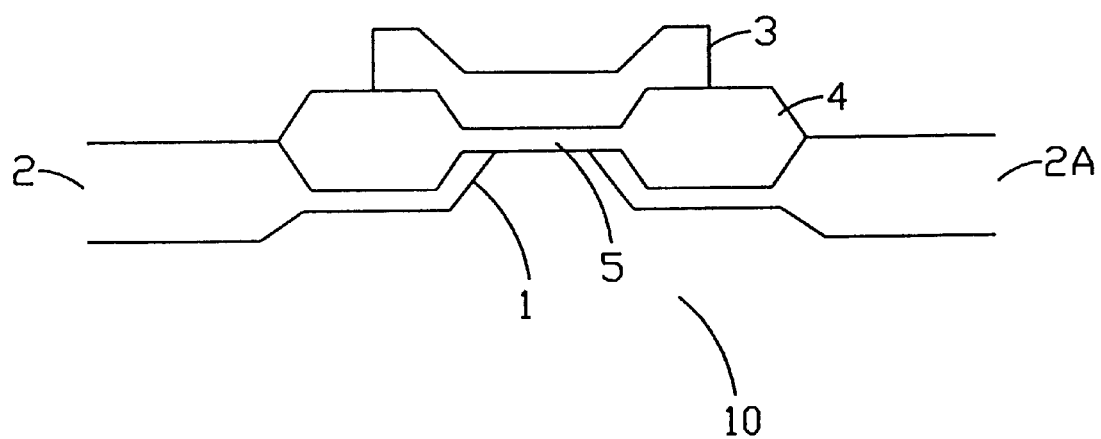
FIG. 1 shows the cross section of a conventional high-voltage complimentary metal-oxide-semiconductor (HV-CMOS) transistor.
Figure 2A:
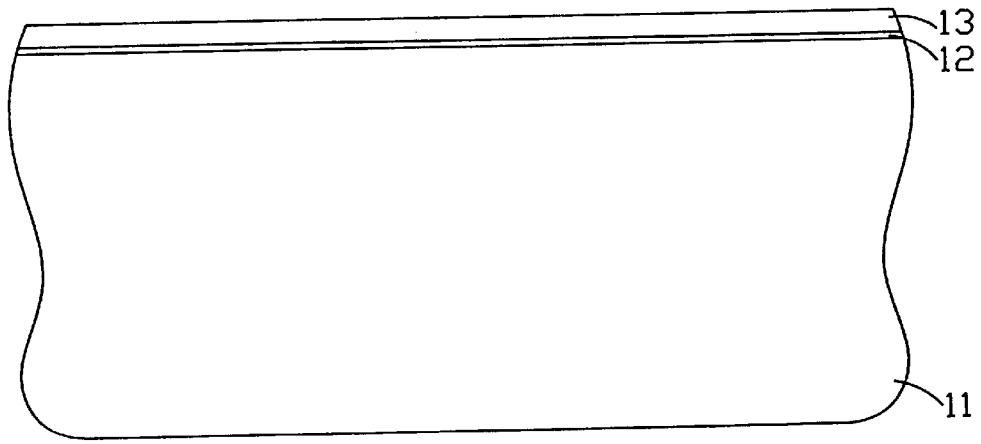
FIGS. 2A to 2G show cross-sectional views illustrative of various stages in the fabrication of a high-voltage semiconductor device in accordance with one embodiment of the present invention.

Referring to FIG. 2A, a pad oxide layer 12 having a thickness of about 100–200 angstroms is formed on a p-type silicon substrate 11. This pad oxide layer 12 is preferably formed by a conventional thermal oxidation process. A silicon nitride layer 13 is then deposited on the pad oxide layer 12. In this embodiment, the silicon nitride layer 13 is deposited by a standard low pressure chemical vapor deposition (LPCVD) technique, and has a thickness of about 1000 to 2000 angstroms. The silicon nitride layer 13 mentioned above will be used as a blocking layer in a later implantation step.

Figure 2B:
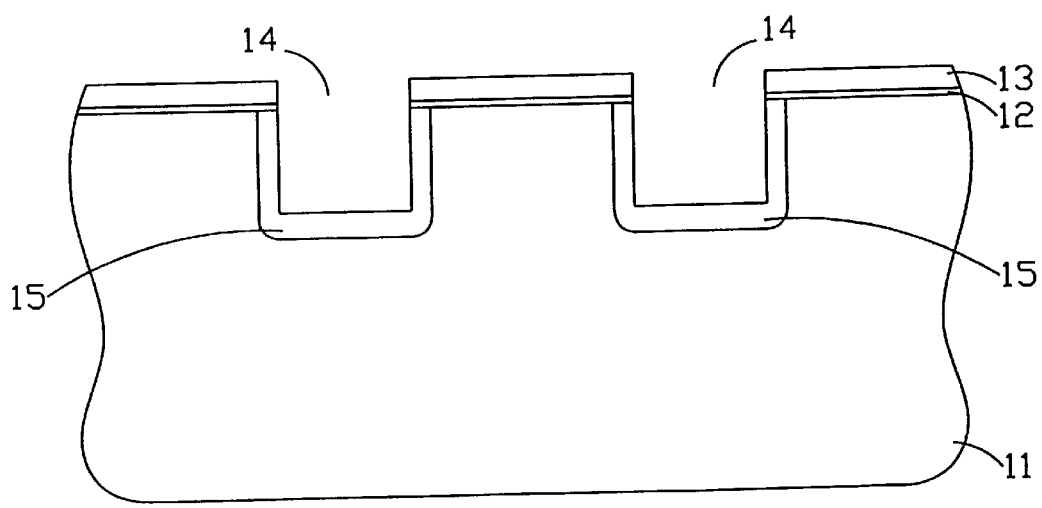

Conventional photolithography techniques are employed to define two trench areas 14 over the silicon nitride layer 13. Consequently, the silicon nitride layer 13, the pad oxide layer 12 and the substrate 11 are anisotropically etched, resulting in the structure shown in FIG. 2B.

Figure 2C:
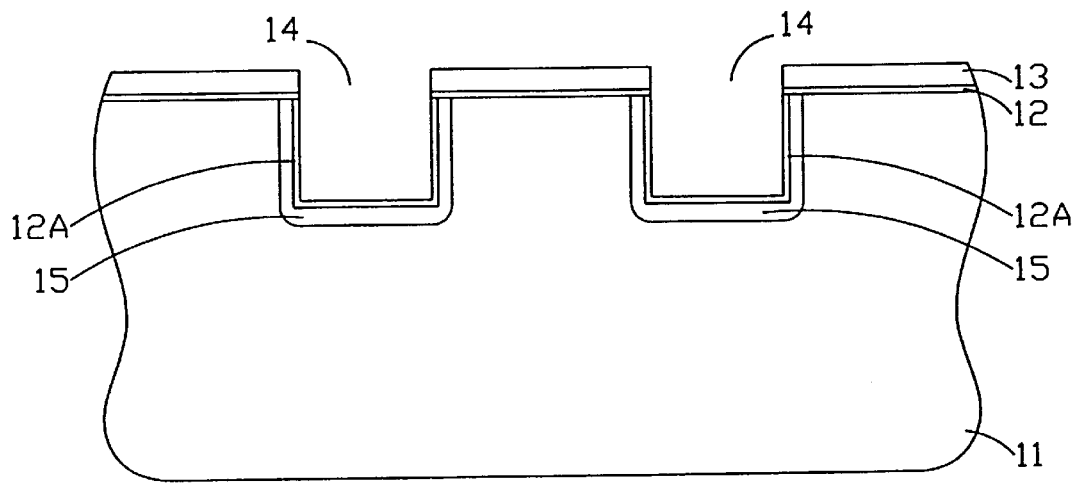

Referring to FIG. 2C, the substrate 11 is implanted with n-type ions by using the silicon nitride layer 13 as a block, thus forming drift region 15 adjacent to the sidewall and the bottom surface of the trenches 14. Next, a silicon oxide layer 12A is formed on the inner sidewall and the bottom surface of the trenches 14. The thickness of the silicon oxide layer 12A is about 100–500 angstroms.

Figure 2D:
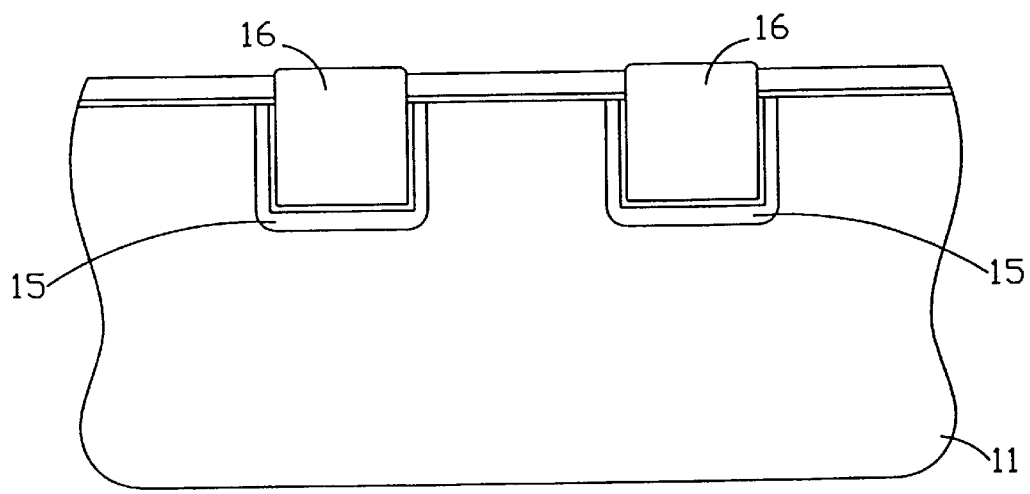
Figure 2E:
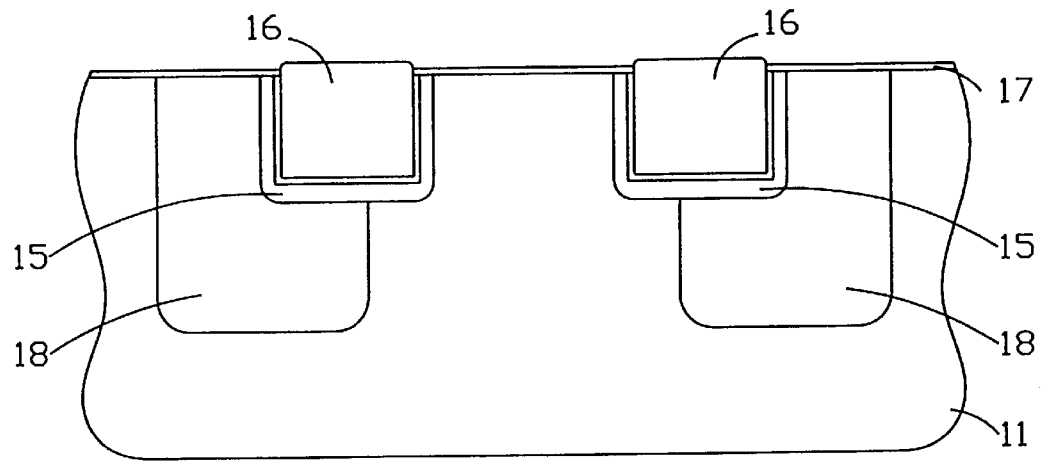

Another oxide layer 16 is further formed over the substrate 11, and therefore fills the trenches 14 (FIG. 2D). This oxide layer 16 is preferably deposited to a thickness of about 5000–9000 angstroms by a standard atmospheric pressure chemical vapor deposition (APCVD) process. The deposited oxide layer 16 is then subjected to a high temperature (about 1150° C.) treatment to be densified. Subsequently, a conventional planarization method, such as chemical mechanical polishing (CMP), is performed until the top surface of the oxide layer 16 within the trench 14 area is substantially level with the top surface of the silicon nitride layer 13.

After the silicon nitride layer 13 and the silicon oxide layer 12 are removed by a conventional method, an oxide layer 17 having a thickness of about 100–200 angstroms is further thermally grown on the surface of the substrate 11. Conventional photolithography techniques are then employed to define two well areas, followed by n-type ion implantation and standard annealing process. Therefore, two n-well regions 18 are thus generated. Specifically, each of the well regions 18 is adjacent to its nearby filled oxide region 16, and is spaced from the channel region (i.e., the region between the two filled oxide regions 16) by said nearby oxide region 16.

Figure 2F:
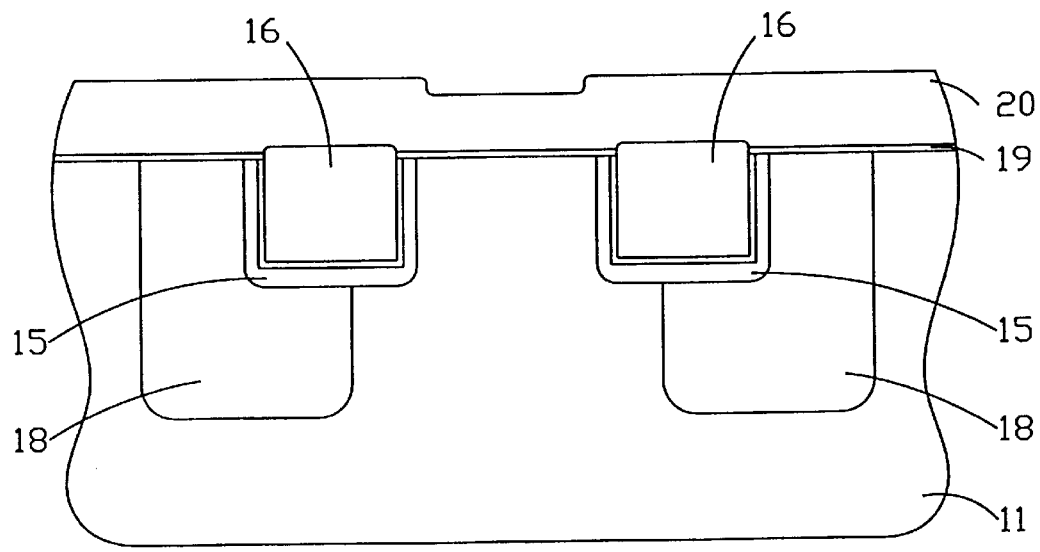

After the oxide layer 17 is removed by a conventional etch method, a gate oxide layer 19 and an n-doped polysilicon layer 20 are then formed on the substrate 11 as shown in FIG. 2F. In this embodiment, the gate oxide layer 19 has a thickness of about 2000–3000 angstroms, and is preferably formed by a conventional low-pressure chemical vapor deposition (LPCVD).

Figure 2G:
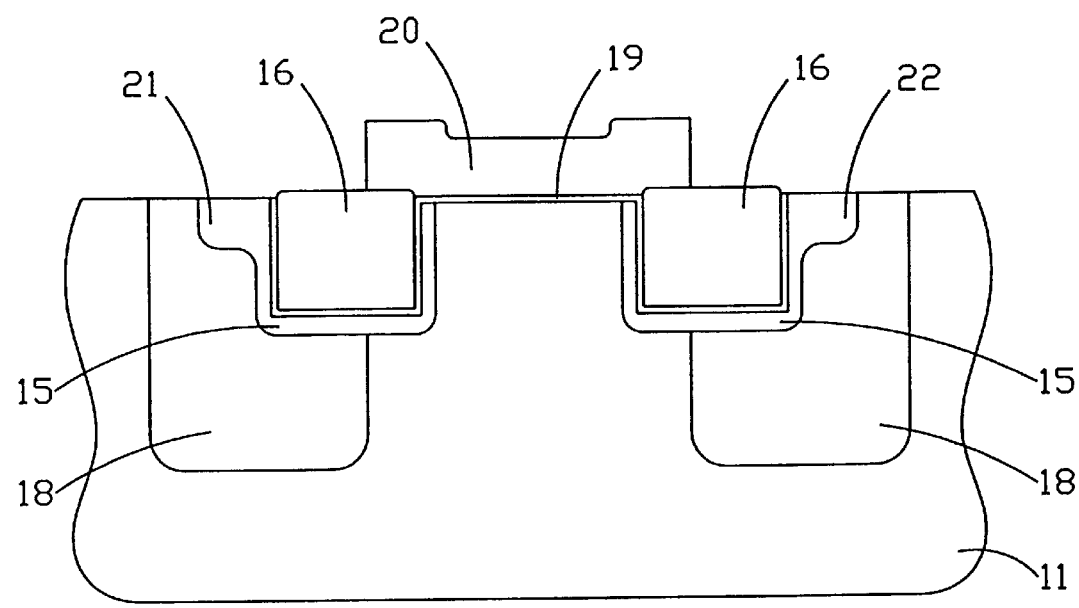

Finally, referring to FIG. 2G, another photolithography techniques are employed to define source 21/drain 22 regions. After performing n-type ion implantation, a source region 21 and a drain region 22 are thus achieved. Specifically, each of the source/drain regions is adjacent to its nearby filled oxide region 16, and is spaced from the channel region by said nearby filled oxide region 16. Particularly, the concentration of the source 21/drain 22 regions is higher than that of the drift regions 15. In this embodiment, the source 21/drain 22 regions have concentration of about $8E19/cm^3$, while the drift regions 15 have concentration of about $6E16/cm^3$.

According to the present invention, the drift regions 15 of the fabricated semiconductor device, particularly of a high-voltage device, have the length equal to the total length encompassing the sidewall and the bottom of the trenches 14. Therefore, the operation voltage of the fabricated device is substantially increased due to the enlarged drift length. Furthermore, two n-wells 18 are also formed in the fabricated device to improve current driving capability, thus making the integration of the high- and low-voltage devices possible in a deep-submicron semiconductor technology.

It is further noted that the vertical-oriented drift region in the present invention consumes less chip area than the horizontal-oriented drift region in the prior art, thus making the integrated circuits denser.

Although specific embodiments have been illustrated and described, it will be obvious to those skilled in the art that various modifications may be made without departing from what is intended to be limited solely by the appended claims.

What is claimed is:

1. A method for forming a semiconductor device, comprising:

providing a semiconductor substrate having a first conductivity type;

forming a blocking layer on said substrate;

defining and etching said blocking layer and said substrate to form at least two trenches therein;

firstly implanting said substrate using said blocking layer as a mask to form at least two drift regions having a second conductivity type opposite to the first conductivity type;

refilling said trenches by a dielectric layer to form at least two dielectric regions in said substrate, one of said dielectric regions being spaced from the other of the dielectric regions by a channel region;

forming and patterning a gate layer to form a gate region on said substrate, said gate region covering the channel region and portions of said dielectric regions; and secondly implanting said substrate to form source/drain region using said gate region and said dielectric regions as a mask.

2. The method according to claim 1, wherein said semiconductor substrate comprises silicon.

3. The method according to claim 1, wherein said dielectric layer comprises silicon oxide.

4. The method according to claim 1, further comprising forming a silicon oxide layer on sidewall surface and bottom surface of said trenches.

5. The method according to claim 1, further comprising implanting said substrate to form at least two implanted regions having the second conductivity type, each of said implanted regions being adjacent to one of said dielectric regions, and each of said implanted regions being spaced from the channel region by such adjacent dielectric region.

6. The method according to claim 1, wherein said gate layer comprises a gate oxide layer.

7. The method according to claim 6, wherein said gate layer further comprises a polysilicon layer formed on said gate oxide layer.

8. The method according to claim 1, wherein said first conductivity type is p-conductivity type and said second conductivity type is n-conductivity type.

9. A method for forming a semiconductor device, comprising:

providing a semiconductor substrate having a first conductivity type;

forming a pad oxide layer on said substrate;

forming a silicon nitride layer on said pad oxide layer;

defining and etching said silicon nitride layer, said pad oxide layer and said substrate to form at least two trenches therein;

firstly implanting said substrate using said silicon nitride layer as a mask to form at least two drift regions having a second conductivity type opposite to the first conductivity type;

forming a first oxide layer on sidewall surface and bottom surface of said trenches;

refilling said trenches by a second oxide layer to form at least two oxide regions in said substrate, one of said oxide regions being spaced from the other of the oxide regions by a channel region;

densifying said oxide regions;

planarizing said oxide regions;

secondly implanting said substrate to form at least two implanted well regions having the second conductivity type, each of said implanted well regions being adjacent to one of said oxide regions, and each of said implanted regions being spaced from the channel region by such adjacent oxide region;

forming a gate oxide layer over said substrate;

forming a polysilicon layer on said gate oxide layer;

patterning said gate oxide layer and said polysilicon layer to form a gate region on said substrate, said gate region covering the channel region and portions of said oxide regions; and thirdly implanting said substrate to form source/drain region using said gate region and said oxide regions as a mask.

10. The method according to claim 9, wherein said semiconductor substrate comprises silicon.

11. The method according to claim 9, wherein said first conductivity type is p-conductivity type and said second conductivity type is n-conductivity type.

12. The method according to claim 9, wherein said drift regions have doping concentration lower than doping concentration of said source/drain region.

13. The method according to claim 9, wherein said trenches have a depth of about 5000–9000 angstroms.

14. The method according to claim 9, wherein said second oxide layer is formed by atmospheric pressure chemical vapor deposition (APCVD).

15. The method according to claim 9, wherein said first oxide layer has a thickness of about 100–500 angstroms.

* * * * *